(12) United States Patent
Ceballos

(10) Patent No.: US 7,671,773 B2
(45) Date of Patent: Mar. 2, 2010

(54) JITTER INSENSITIVE SINGLE BIT DIGITAL TO ANALOG CONVERTER

(75) Inventor: Jose Luis Ceballos, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/948,001

(22) Filed: Nov. 30, 2007

(65) Prior Publication Data

US 2009/0140898 A1 Jun. 4, 2009

(51) Int. Cl.
*H03M 3/00* (2006.01)
(52) U.S. Cl. ............... 341/143; 341/118; 341/120; 341/144; 341/172
(58) Field of Classification Search ............ 341/143, 341/118, 129, 155, 144
See application file for complete search history.

(56) References Cited

U.S. PATENT DOCUMENTS

| | | | | |
|---|---|---|---|---|
| 4,573,069 | A * | 2/1986 | Lewis, Jr. | 348/646 |
| 6,184,812 | B1 * | 2/2001 | Younis et al. | 341/143 |
| 6,836,228 | B1 * | 12/2004 | Levinson et al. | 341/136 |
| 6,927,718 | B2 * | 8/2005 | Koch | 341/143 |
| 7,151,474 | B2 * | 12/2006 | Ortmanns et al. | 341/143 |
| 7,379,005 | B2 * | 5/2008 | Wiesbauer et al. | 341/144 |
| 7,397,291 | B1 * | 7/2008 | Parkes et al. | 327/176 |
| 7,414,557 | B2 * | 8/2008 | Andersson et al. | 341/143 |
| 2002/0186776 | A1 * | 12/2002 | Cosand | 375/247 |
| 2006/0139192 | A1 * | 6/2006 | Morrow et al. | 341/143 |
| 2007/0018867 | A1 * | 1/2007 | Uemori et al. | 341/143 |
| 2007/0164884 | A1 * | 7/2007 | Ihs | 341/143 |

* cited by examiner

*Primary Examiner*—Linh V Nguyen
(74) *Attorney, Agent, or Firm*—Lee & Hayes, PLLC

(57) ABSTRACT

Systems and methods for a jitter insensitive 1-bit digital to analog converter (DAC) are described. The jitter insensitive 1-bit DAC employed in the feedback loop of a delta sigma analog to digital converter (ADC) converts a 1-bit digital data into the corresponding analog output.

17 Claims, 7 Drawing Sheets

JITTER INSENSITIVE SINGLE BIT DIGITAL TO ANALOG CONVERTER

BACKGROUND

Generally, electronics may deal with both digital and analog signals. Therefore, many electronic devices require conversion of digital signal(s) into corresponding analog signal(s). For example, a television set-top box requires conversion of digital signals to corresponding analog audio/video signals. Typically, a digital-to-analog convertor (DAC) is used for this purpose.

Depending upon the device's requirement, a DAC employed can be multi-bit or single-bit. Certain devices or circuits may require DACs with low resolution and high linearity, and cannot make use of a multi-bit DAC. In such devices, 1-bit DACs are usually implemented. For example, 1-bit DACs are used in delta sigma systems such as CD players, etc. Jitter can be an issue in 1-bit DACs. In order to address the jitter problem in 1-bit DACs, clocks having high precision and negligible signal variations are currently used; however, employing such high precision clocks in the 1-bit DAC can be very costly.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

The following description introduces concepts related to a 1-bit jitter insensitive digital-to-analog converter (DAC) employed in a continuous-time delta sigma analog-to-digital converter (ADC).

Continuous-time delta sigma ADCs are used in communication systems for converting analog signal(s) to corresponding digital signal(s). A typical delta sigma ADC employs a 1-bit DAC in a feedback loop to generate a quantization error signal. However, 1-bit DACs may suffer from jitter, which can be considered as an additional noise source, reducing the overall signal to noise ratio (SNR). The disclosed techniques relate to implementing a 1-bit jitter insensitive DAC.

A jitter insensitive DAC includes a constant current generator implemented using a plurality of MOSFETs, capacitors, and switches. A current generator produces jitter insensitive current at regular intervals dictated by a reset signal. The jitter insensitive current is fed to a differential source that produces a fully differential analog output corresponding to 1-bit digital data fed at its input. A reset signal controls the operation of the current generator in such a way that even if a jitter occurs in the reset signal, the current produced remains unaffected. Return-to-zero (RZ) coding scheme is adopted for the current, reducing data dependent nonlinearities. In the RZ coding scheme, the current pulse falls to zero completely before the rise of the next current pulse.

Exemplary System

Figure 1:
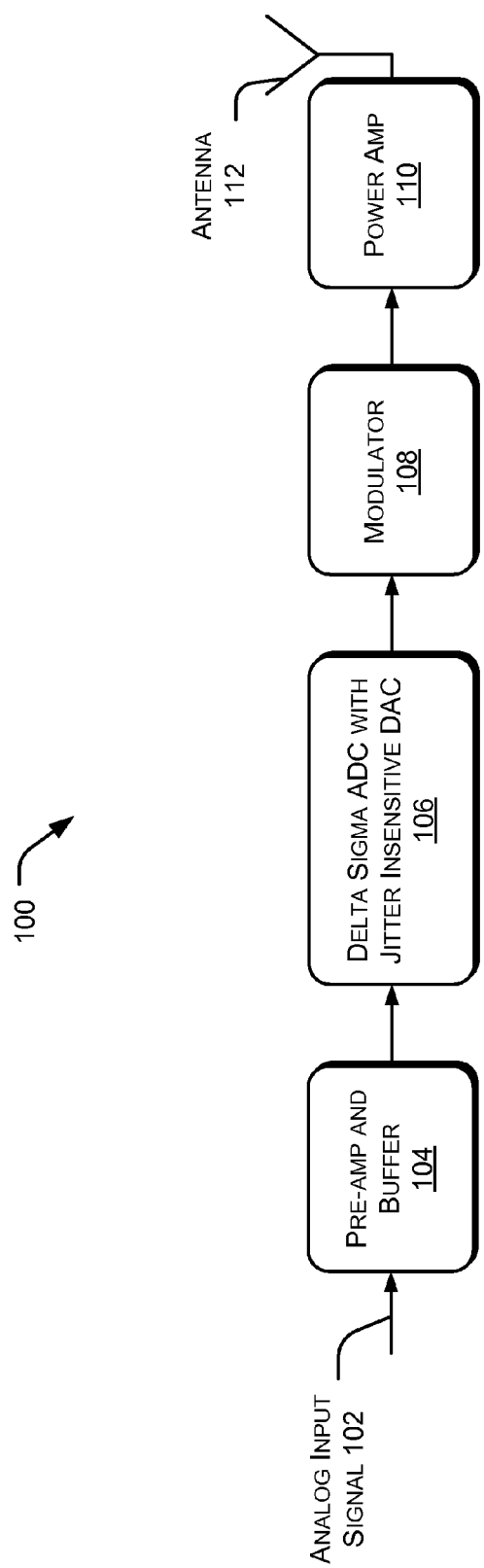
FIG. 1 is a block diagram illustrating an exemplary communication system using a jitter insensitive digital-to-analog converter (DAC) included in a delta sigma analog-to-digital converter (ADC).

FIG. 1 illustrates an exemplary system 100 that includes a delta sigma ADC with a jitter insensitive DAC. The system 100 can be a generic communication system that can be implemented in various applications such as radio transmission, mobile communication, and the like. The system 100 can be implemented as an apparatus of various apparatuses. The system 100 is described with reference to a mobile communication transmission system/device; however, it will be appreciated that the system 100 can be used in any various other devices or systems.

The system 100 includes an analog input signal 102, a pre-amplifier and buffer 104, a delta sigma ADC with jitter insensitive DAC 106, a modulator 108, a power amplifier 110, and an antenna 112.

In an implementation, the system 100 receives an analog input signal 102 such as an audio signal, from an input device such as a microphone. The analog input signal 102 passes through a pre-amplifier and buffer block 104. The pre-amplifier and buffer block 104 amplifies the analog input signal 102 for further processing. The pre-amplifier and buffer block 104 provides a voltage gain, but no significant current gain. The pre-amplifier and buffer block 104 can additionally provide electrical impedance transformation to the analog input signal 102 before further processing.

The delta sigma ADC with jitter insensitive DAC 106, also referred to as delta sigma ADC 106, samples and quantizes the analog signal 102 using a 1-bit jitter insensitive DAC. The sampled and quantized signal can be converted into a multi-bit data stream by employing a digital low pass filter and a digital decimation circuit. The digital decimation filter removes quantization noise from the signal.

A 1-bit jitter insensitive DAC is implemented in the feedback loop of the delta sigma ADC 106. The 1-bit jitter insensitive DAC produces an analog signal corresponding to 1-bit delta sigma data it receives. The 1-bit jitter insensitive DAC includes a current generator that produces jitter insensitive current, which can be fed to a differential source that produces a differential analog output as dictated by the 1-bit delta sigma data received by it.

The sampled and quantized signal from the delta sigma ADC 106 is passed to the modulator 108 for modulation. The modulator 108 transfers a digital bit stream over an analog band pass channel, such as a public switched telephone network (PSTN). In an implementation, digital baseband modulation can be carried out. Digital baseband modulation transfers a digital bit stream over an analog low pass channel using a discrete number of signal levels.

The power amplifier 110 receives the modulated signal from the modulator 108. The power amplifier 110 amplifies and increases the power efficiency of the modulated signal. In an implementation, such as in a mobile communication system, the power amplifier 110 can be a class C or D non-linear amplifier working in the saturated mode close to the cut-off mode. The amplified signal from the power amplifier 110 can be transmitted wirelessly via an antenna 112.

Figure 2:
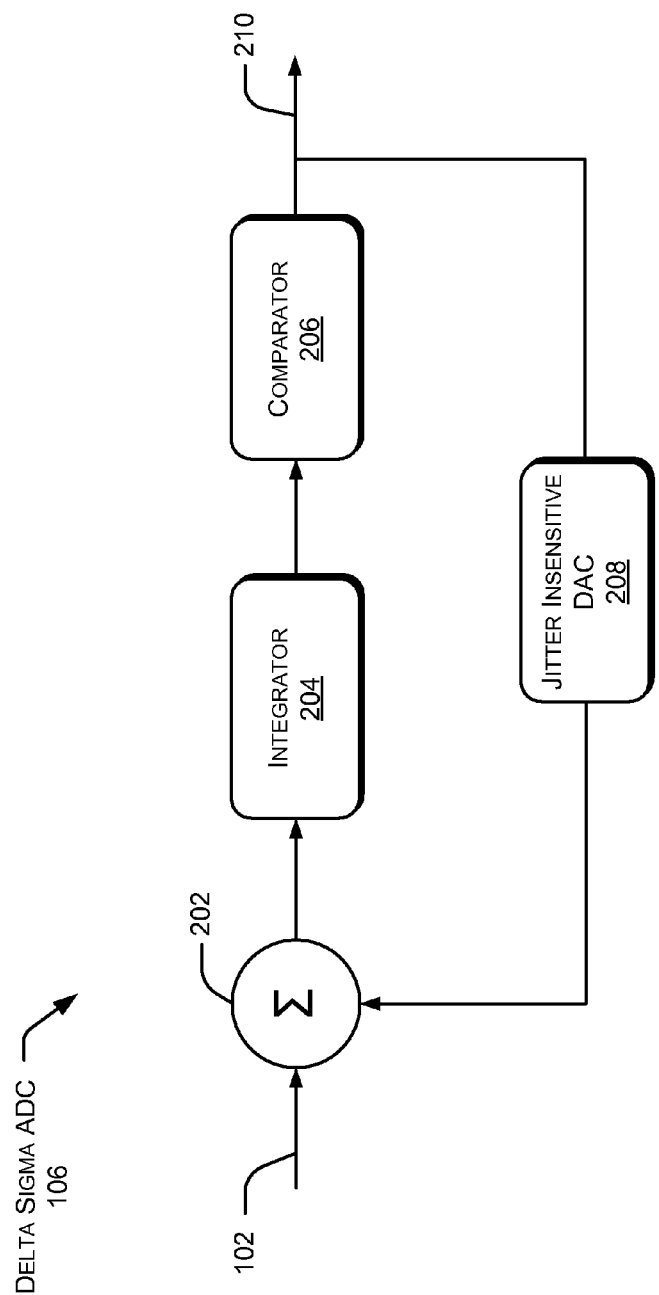
FIG. 2 is a block diagram illustrating an exemplary delta sigma ADC including a jitter insensitive DAC.

FIG. 2 illustrates a delta sigma ADC 106 including a jitter insensitive DAC. To this end, the 1-bit delta sigma ADC 106 discussed above, includes a summing device 202, an integrator 204, a comparator 206, and a 1-bit jitter insensitive DAC 208.

The summing device 202 can be any device that can perform a difference operation. One of the input signals to a summing device 202 can be the analog input signal 102, while the other input signal can be a feedback signal from the 1-bit jitter insensitive DAC 208, also referred to as DAC 208.

The difference signal from the summing device 202 can be fed to the integrator 204. The integrator 204 can be a fully differential integrator. The integrator 204 can be replaced with any other higher order loop filter. In certain implementations, the integrator 204 can be part of another circuit based on integrators.

In such an implementation, the integrator 204 continuously integrates the difference between the analog input signal 102 and the feedback signal received through the feedback loop that includes the DAC 208.

The comparator 206 receives the output signal from the integrator 204 or loop filter output. The comparator 206 compares the input voltages or currents and switches its output based on the inputs. The comparator 206 may be a 1-bit comparator. The comparator 206 compares the signal received from the integrator 204 with a reference voltage, which can be a pre-defined value. The reference voltage can be ground or zero volts. For example, the output signal from the comparator 206 can switch from a low to a high value if the output of the integrator 204 rises above the reference voltage. Similarly, the output signal from the comparator 206 can switch from a high to a low value if the output of the integrator 204 drops below the reference voltage or remains unchanged. Together, the integrator 204 and the comparator 206 can convert the analog input signal 102 into a time discrete sampled signal.

The 1-bit data stream received from the comparator 206 can be fed to the jitter insensitive DAC 208 placed in the feedback loop of the delta sigma ADC 106. The jitter insensitive DAC 208 can produce an analog signal corresponding to the 1-bit data stream. The analog signal from the jitter insensitive DAC 208 is fed back to the summing device 202. Therefore, the jitter insensitive DAC 208 can produce a jitter free output even if any jitter or signal variation occurs in the clock pulse driving the operation of the jitter insensitive DAC 208.

Exemplary Jitter Insensitive DAC

Figure 3:
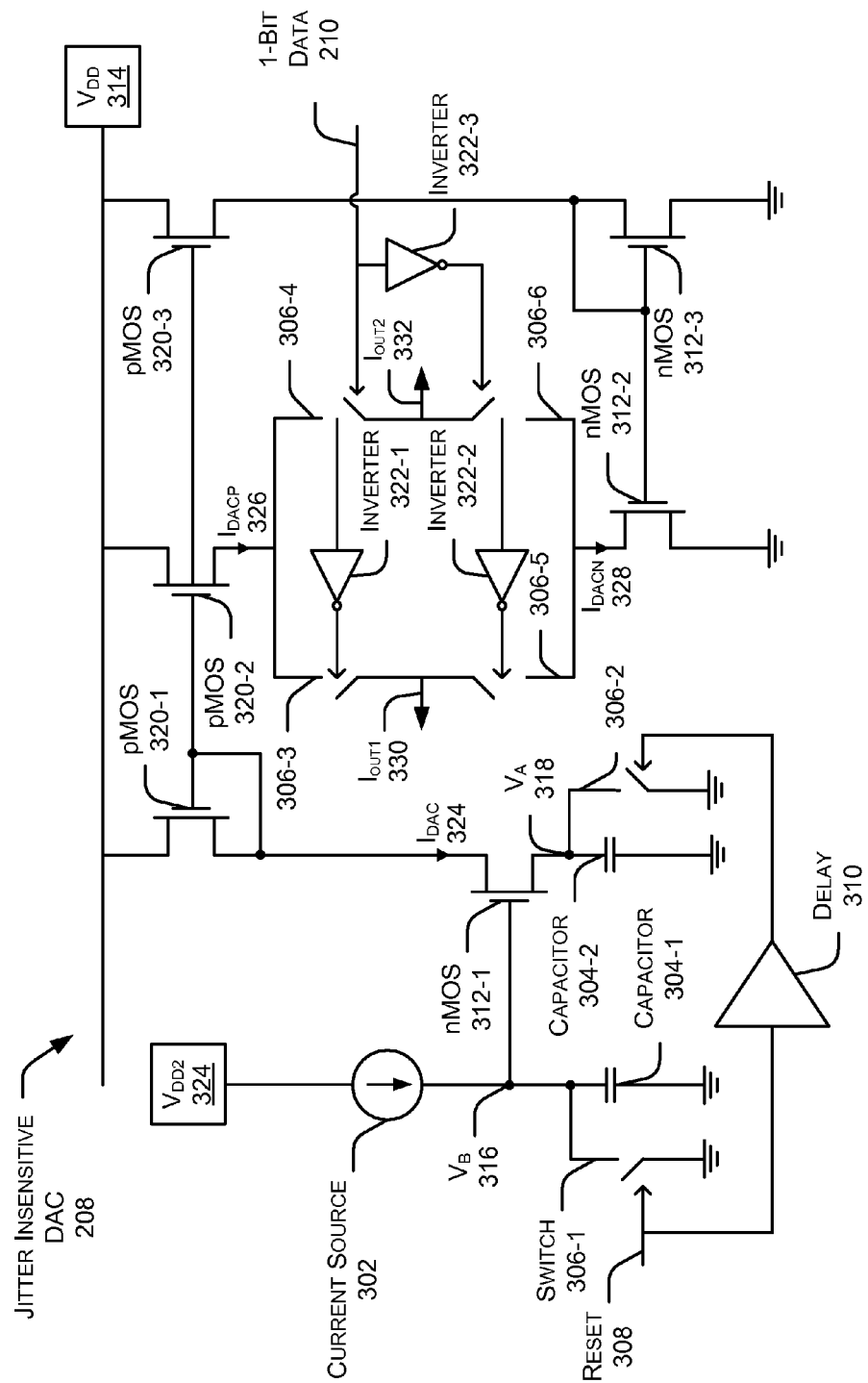
FIG. 3 is an exemplary circuit for a jitter insensitive DAC.

FIG. 3 illustrates an exemplary circuit of jitter insensitive DAC 208. In an implementation, the DAC 208 is a 1-bit DAC that can be employed in the feedback loop of a delta sigma ADC 106. In an implementation, the DAC 208 can be a combination of various electronic circuits such as a current generator, current mirrors, and a differential source. Such electronic circuits can be realized using electronic components such as transistors, capacitors, and so on.

The DAC 208 includes a constant current generator, which includes a current source 302 that supplies current to capacitor 304-1. Switches 306-1 and 306-2 included in the constant current generator can change circuit connections based on one or more external inputs such as a reset signal 308. A delay element 310 can be included in the path of the reset signal 308 towards the switch 306-2. A transistor nMOS 312-1, which is configured as a source follower is also included in the constant current generator. $V_{DD}$ 314 is the common supply voltage driving the circuitry of the constant current generator included in the DAC 208; however, other potential (i.e., common supply voltage) may be provided. $V_B$ 316 and $V_A$ 318 represent voltages measured across the capacitors 304-1 and 304-2 respectively. Some transistors in the DAC 208 can be diode-connected to act as current mirrors such as transistors nMOS 312-2 and nMOS 312-3 which form an n-type current mirror, and transistors pMOS 320-1, 320-2, 320-3 which form p-type current mirrors. A differential source included in the DAC 208 can be realized using the switches 306-3, 306-4, 306-5, 306-6 and inverters 322-1, 322-2 and 322-3 (collectively referred to as inverters 322). Inverters 322 are logical NOT gates that are used for inversion of the 1-bit data 210. $I_{DAC}$ 324 represents the current flowing through the transistor nMOS 312-1. $I_{DACP}$ 326 and $I_{DACN}$ 328 represent mirrored current $I_{DAC}$ 324 with opposite polarities. $I_{OUT1}$ 330 and $I_{OUT2}$ 332 represent fully differential output currents. In other configurations, the circuit of DAC 208 may be flipped, or in other words, nMOS would be pMOS and vice versa.

The current source 302 supplies constant current to the capacitor 304-1. The capacitor 304-1 can be charged or discharged based on the state of the switch 306-1, as dictated by the reset signal 308. In certain implementations, current source 302 may be tied to $V_{DD}$ 314; however, current source 302 may be tied to and receive voltage from other power supplies as indicated by $V_{DD2}$ 324.

Figure 4:
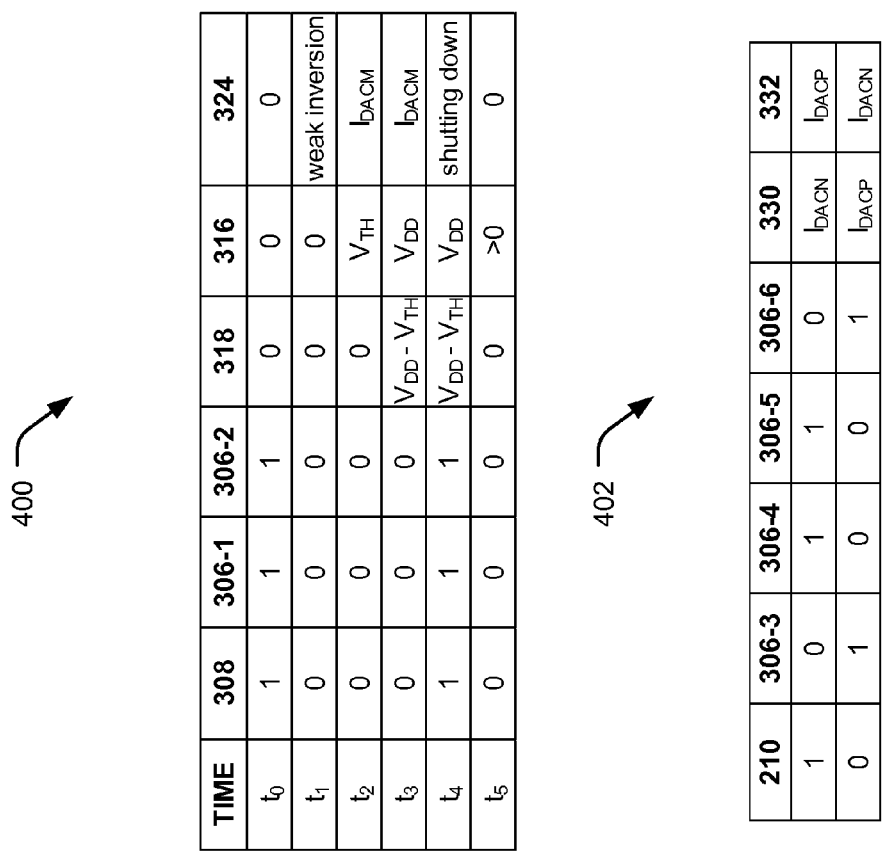
FIG. 4 are exemplary logic tables indicating outputs of a jitter insensitive DAC in response to varying inputs.

Now referring to FIG. 4, as seen from table 400, at to, the reset signal 308 is set to one, closing the switches 306-1 and 306-2 and thereby discharging the capacitors 304 via ground and making the voltages $V_B$ 316 and $V_A$ 318 equal to zero. Also, the current $I_{DAC}$ 324 remains zero at this instance.

At $t_1$, the state of the reset signal 308 changes from high to low, and the switch 306-1 opens. The switch 306-2 remains closed because of the presence of the delay element 310. Delay element 310 is for a few picoseconds, and switch 306-2 remains closed to minimize glitch effects at output due to the switching process. The voltages $V_B$ 316 and $V_A$ 318 remain at zero. Also, the current $I_{DAC}$ 324 remains zero.

At $t_2$, the switches 306-1 and 306-2 remain open and capacitor 304-1 is charged. While the capacitor 304-1 charges, the voltage $V_B$ 316 rises. On reaching the voltage $V_{TH}$, the transistor nMOS 312-1 is fully activated and $V_A$ 318 starts growing, following $V_B$ 316. The current $I_{DAC}$ 324 reaches its maximum at this instance.

At $t_3$, the voltage $V_B$ 316 reaches a maximum value, which can be equal to the supply voltage $V_{DD}$ 314. At this point, the nMOS 312-1 tends to enter in cut-off. The voltage $V_A$ 318 will reach a maximum value, equal to the difference of the supply voltage $V_{DD}$ 314 and the threshold voltage $V_{TH}$.

At $t_4$, the reset signal 308 again rise to a high state (logic 1), thereby closing the switches 306 and making the voltages $V_B$ 316 and $V_A$ 318 equal to zero by discharging the capacitors 304 via ground, with the current $I_{DAC}$ 324 reducing to zero.

At $t_5$, the reset signal 308 goes to low state and the process described above repeats itself generating the next current pulse of current $I_{DAC}$ 324.

Referring back to FIG. 3, for producing jitter free output, the current $I_{DAC}$ 324 should be jitter insensitive. In other words, there should not be any variation in pulsed current from cycle to cycle.

Jitter usually occurs in the reset signal 308, which may be reflected in the current $I_{DAC}$ 324. In the DAC 208, if any jitter occurs in the reset signal 308, for example, a jitter can occur in the reset pulse at $t_5$ when going to low from the high state. Due to the occurrence of the jitter, the reset pulse goes low before the expected time, thereby initiating the operation of charging the capacitors earlier. Due to this, the current $I_{DAC}$ 324 starts rising before the expected time. To ensure that the current $I_{DAC}$ 324 remains jitter insensitive, the width of a current pulse should be maintained constant. In an implementation, a current pulse corresponding to the current $I_{DAC}$ 324 is generated and the RZ coding scheme of the current pulses ensures that the falling edge of the current pulse synchronizes with the rising edge of the current pulse. Thus, the width of the generated current pulse remains constant, making the current $I_{DAC}$ 324 jitter insensitive.

The jitter insensitive current $I_{DAC}$ 324 can be replicated in two branches of the circuit (DAC 208) with the use of current mirrors. In an implementation, a current mirror realized by transistors pMOS 320-1 and pMOS 320-2 reproduces the current $I_{DAC}$ 324 as $I_{DACP}$ 326 with positive polarity. Current mirror realized by transistors nMOS 312-2 and nMOS 312-3 reproduces the current $I_{DAC}$ 324 as $I_{DACN}$ 328 with negative polarity. In another implementation, the current mirrors can be realized using other types of transistors, such as BJT, JFET, etc. The currents $I_{DACP}$ 326 and $I_{DACN}$ 328 form input to the differential source included in the DAC 208. In certain implementations, instead of mirroring the nMOS current (i.e., $I_{DAC}$ 324) into a pMOS mirror (i.e., pMOS 320-3) and back into and nMOS current (i.e. nMOS 312-3 and nMOS 312-2) to get $I_{DACN}$ 328, another current generator, with its own current source, switches and capacitors, can be used to generate the nMOS current.

The 1-bit data 210 obtained from a delta sigma ADC 106 can be fed to the differential source. Depending upon the 1-bit data 210, the differential source produces fully differential output currents $I_{OUT1}$ 330 and $I_{OUT2}$ 332.

Referring to FIG. 4, as seen in table 402, when the 1-bit data 210 is high (i.e. equal to 1), the switches 306-4 and 306-5 are closed while the switches 306-3 and 306-6 are open. Again, referring back to FIG. 3, the current $I_{DACP}$ 326 flows through the switch 306-4 of the differential source making the output $I_{OUT2}$ 332 equal to $I_{DACP}$ 326. The current $I_{DACN}$ 328 flows through the switch 306-5 of the differential source making the output $I_{OUT1}$ 330 equal to $I_{DACN}$ 328. When the 1-bit data 210 is low (i.e. equal to 0), the switches 306-3 and 306-6 are closed while the switches 306-4 and 306-5 are open. The current $I_{DACP}$ 326 flows through the switch 306-3 of the differential source making the output $I_{OUT1}$ 330 equal to $I_{DACP}$ 326. The current $I_{DACN}$ 328 flows through the switch 306-6 of the differential source making the output $I_{OUT2}$ 332 equal to $I_{DACN}$ 328. The difference of the currents $I_{OUT1}$ 330 and $I_{OUT2}$ 332 can be fed back at the input of the delta sigma ADC 106.

Exemplary Timing Diagram

Figure 5:
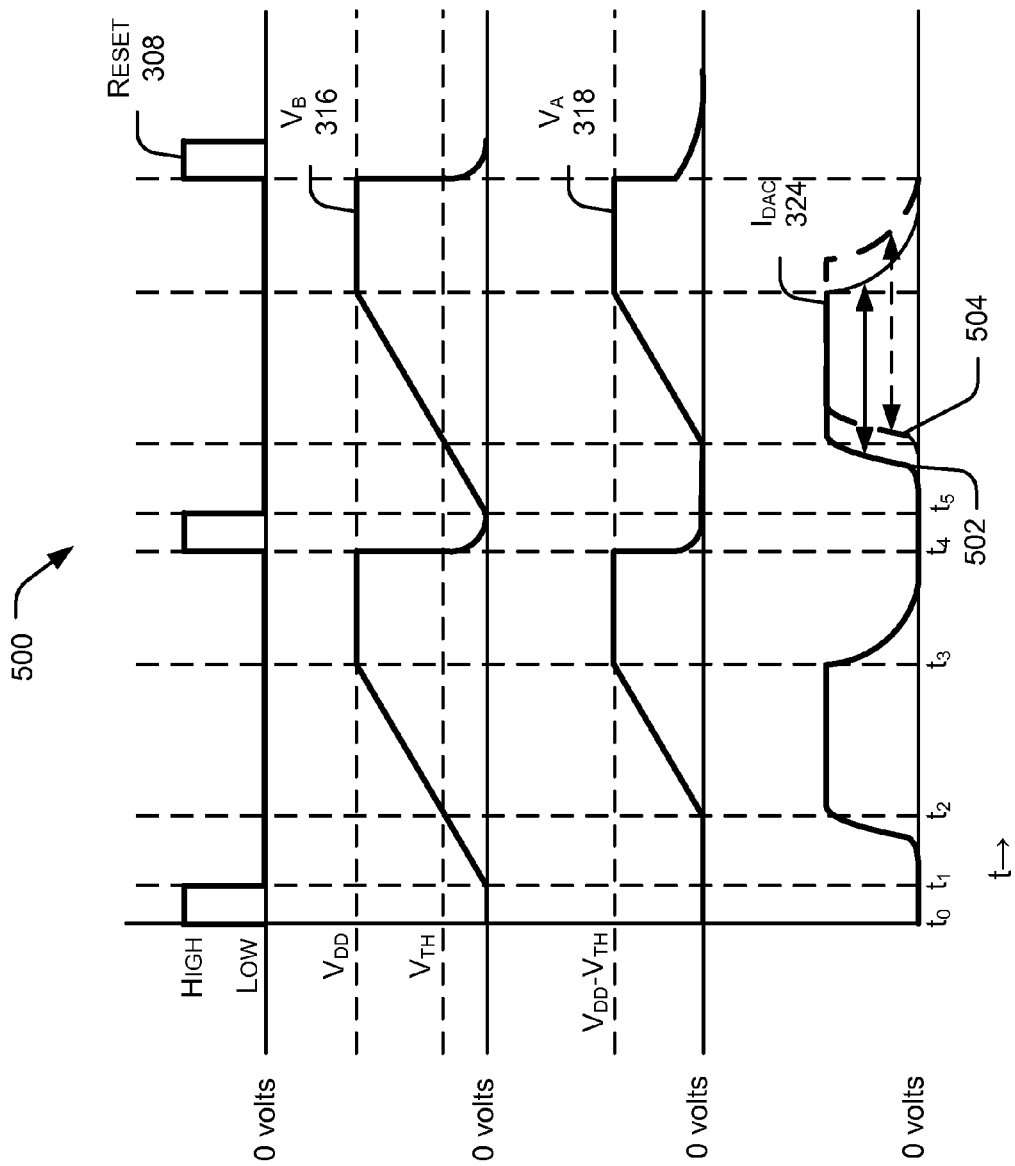
FIG. 5 is an exemplary timing diagram for a jitter insensitive DAC.

FIG. 5 illustrates an exemplary timing diagram 500 for the DAC 208. The timing diagram 500 shows variations of voltages $V_B$ 316 and $V_A$ 318, and the current $I_{DAC}$ 324 at various instances of time in accordance with the reset signal 308.

As can be seen from the timing diagram 500, between $t_0$ and $t_1$ the reset signal 308 remains in a high state (logic 1). During this interval, the voltages $V_B$ 316 and $V_A$ 318, and the current $I_{DAC}$ 324 are maintained at zero. At $t_1$, the pulse of the reset signal 308 falls to a low state (logic 0). At this point, the voltage $V_B$ 316 just begins rising. The voltage $V_A$ 318 and the current $I_{DAC}$ 324 remain zero.

At $t_2$, the reset signal 308 is in the low state. The voltage $V_B$ 316 rises to the threshold voltage $V_{TH}$. With $V_B$ 316 reaching equal to $V_{TH}$, the voltage $V_A$ 318 starts building up, thereby producing the current $I_{DAC}$ 324. Ideally, the current $I_{DAC}$ 324 should start building when the voltage $V_A$ 318 starts rising, but due to weak inversion operation in nMOS 312-1, the current $I_{DAC}$ 324 starts rising even before $t_2$. The portion of the current curve in the timing diagram 500, which shows excess current that is built before $t_2$, can be referred to as a weak inversion region.

At $t_3$, the reset signal 308 remains in the low state. The voltage $V_B$ 316 reaches its maximum value, which is equal to the supply voltage $V_{DD}$ 314. Following the pattern of the voltage $V_B$ 316, the voltage $V_A$ 318 also reaches its maximum value, which is equal to the difference of the supply voltage $V_{DD}$ 314 and the threshold voltage $V_{TH}$. Both the voltages $V_B$ 316 and $V_A$ 318 can be maintained at their respective maximum values until the reset signal 308 goes to the high state. At $t_3$, the current $I_{DAC}$ 324 begins to decrease from its maximum value $I_{DACM}$ as the voltage $V_A$ 318 stops rising and becomes constant. Ideally, the current $I_{DAC}$ 324 should fall to zero at the very moment when the voltage $V_A$ 318 reaches its maximum value and stops rising further; however, due to inherent imperfections in circuit elements, the current $I_{DAC}$ 324 takes some time to settle down to zero. The portion of the current curve just after $t_3$ in the timing diagram 500, which shows the excess current, is called the shutting down region.

At $t_4$, the reset signal 308 rises to the high state. The voltages $V_B$ 316 and $V_A$ 318 begin to decrease exponentially, as can be seen from the timing diagram 500. Meanwhile, the current $I_{DAC}$ 324 settles to zero. Until the reset signal 308 becomes low at $t_5$, the voltages $V_B$ 316 and $V_A$ 318, and the current $I_{DAC}$ 324 remain at zero. At $t_5$, the process described above repeats itself.

It is to be noted that a current pulse of the current $I_{DAC}$ 324 falls to zero completely and remains at zero until the reset signal 308 becomes low again. Therefore, the current $I_{DAC}$ 324 follows return-to-zero (RZ) coding scheme in which a first pulse falls to zero completely and remains at zero for a pre-specified duration before the rise of a second pulse. The RZ coding scheme ensures that the two consecutive current pulses do not overlap or interfere with one another. This in turn can ensure generation of error-free current $I_{DAC}$ 324.

If jitter occurs in the reset signal 308, a pulse of the reset signal 308 can be delayed. In such a case, a current pulse 502 may also occur late, as represented by a shifted current pulse 504. As can be seen from the timing diagram 500, the falling edge of the current pulse 504 is synchronized with its rising edge by virtue of the jitter insensitive operation scheme, thereby maintaining the width of the current pulse 502. The RZ coding scheme allows a shift in the occurrence of the current pulse 502 without affecting the next current pulse.

Exemplary Methods

Figure 6:
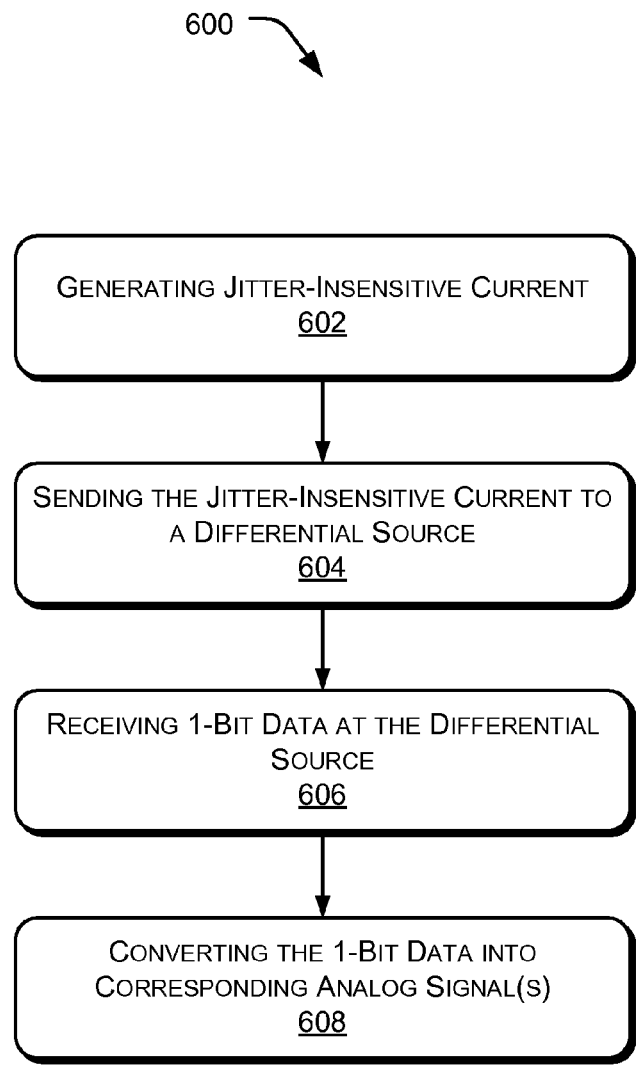
FIG. 6 is a flowchart illustrating an exemplary method for the operation of a jitter insensitive DAC.

FIG. 6 illustrates an exemplary method 600 describing operation of a jitter insensitive DAC. The following description is with reference to the DAC 208. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method can be implemented in any suitable hardware, software, firmware, or a combination thereof, without departing from the scope of the invention.

At block 602, a current generator generates jitter-insensitive current. In an implementation, the constant current generator included in the DAC 208 can be realized with the help of the current source 302, capacitors 304, the nMOS transistor 312-1, the switches 306-1 and 306-2, and the delay element 310. The reset signal 308 controls the operation of the constant current generator. In accordance with the reset signal 308, the capacitors 304 charge and discharge thereby affecting the voltages $V_B$ 316 and $V_A$ 318. The nMOS 312-1 along with the capacitors 304 helps in generation of the current $I_{DAC}$ 324. The current $I_{DAC}$ 324 is made jitter insensitive by making the current $I_{DAC}$ 324 follow the RZ coding scheme and thereby maintaining a constant width for each current pulse.

At block 604, the generated jitter insensitive current can be fed or sent to a differential source. In an implementation, the DAC 208 includes the differential source implemented with the help of the switches 306-3 to 306-6 and invertors 322. The current $I_{DAC}$ 324 can be replicated in a number of circuit branches with the help of current mirrors. In an implementation, the current $I_{DAC}$ 324 can be reproduced as the current $I_{DACP}$ 326 and the current $I_{DACN}$ 328 having opposite polarities. The current $I_{DACP}$ 326 and the current $I_{DACN}$ 328 can be fed to the differential source.

At block 606, a 1-bit data is received at the differential source. In an implementation, the 1-bit data 210 can be received from a delta sigma ADC 106. The 1-bit data 210 can be either 0 or 1.

At block 608, the 1-bit data can be converted to corresponding analog signal(s). In an implementation, the switches in the differential source change their states in accordance with the 1-bit data 210. For example, if the 1-bit data 210 is equal to 0, the switches 306-3 and 306-6 will be closed while the switches 306-4 and 306-5 will remain open. In this state, the current $I_{DACP}$ 326 flows through the switch 306-3 making the output current $I_{OUT1}$ 330 equal to the current $I_{DACP}$ 326. In addition, the current $I_{DACN}$ 328 flows through the switch 306-6 making the output current $I_{OUT2}$ 332 equal to the current $I_{DACN}$ 328.

Figure 7:
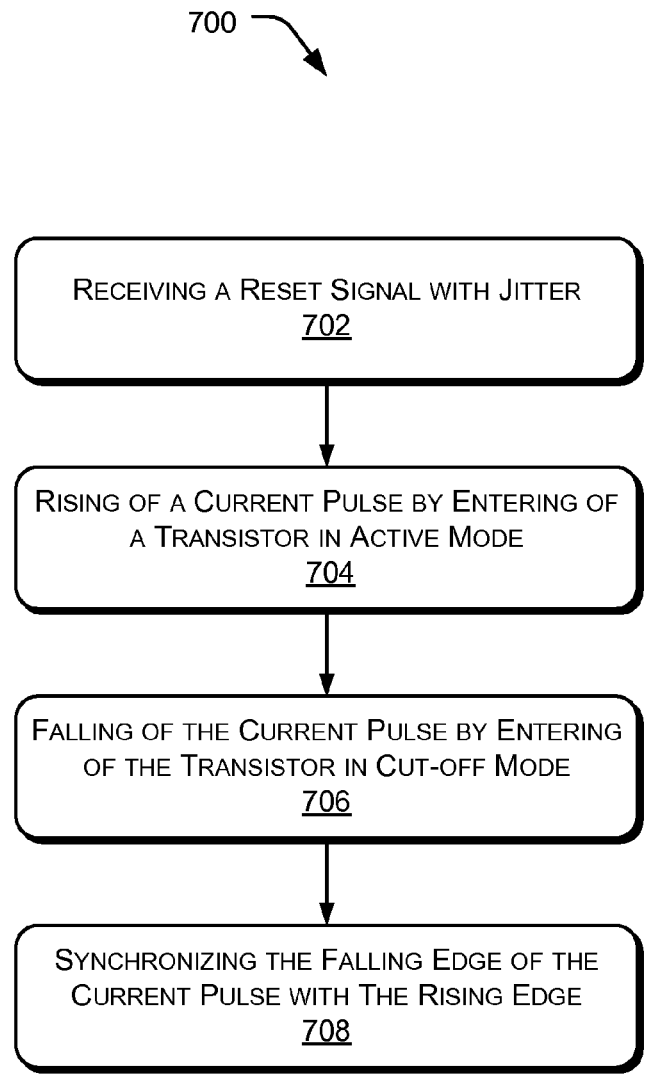
FIG. 7 is a flowchart illustrating an exemplary method for reducing jitters in a jitter insensitive DAC.

FIG. 7 illustrates an exemplary method 700 for generating jitter insensitive current in a DAC. The following description is with reference to the DAC 208. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein. Furthermore, the method can be implemented in any suitable hardware, software, firmware, or a combination thereof, without departing from the scope of the invention.

At block 702, a reset signal with jitter is received. In an implementation, the DAC 208 receives jitter in the reset signal 308. The jitter in the reset signal 308 can occur at any instance. For example, a jitter may occur when a reset pulse goes to a low state from a high state. Occurrence of the jitter in the reset signal 308 can affect the operation of the current generator included in the DAC 208, thereby affecting the current $I_{DAC}$ 324.

At block 704, a transistor enters active mode making a current pulse rise. In an implementation, the transistor nMOS 312-1 enters the active mode as its gate voltage becomes equal to the threshold voltage $V_{TH}$. Due to this, the current $I_{DAC}$ 324 starts building up. A current pulse of $I_{DAC}$ 324 rises from zero to a maximum value, given by $I_{DACN}$.

At block 706, the transistor enters cut-off mode making the current pulse fall. In an implementation, the transistor nMOS 312-1 tends to enter cut-off mode from active mode by transferring charge to the capacitor 304-2. Due to this, the current $I_{DAC}$ 324 begins to fall to zero from the maximum value.

At block 708, the falling edge of the current pulse is synchronized with the rising edge of the current pulse. In an implementation, to ensure that the generated current $I_{DAC}$ 324 is jitter-insensitive, the width of the current pulse needs to be constant. Therefore, the falling edge of the current pulse is synchronized with its rising edge thereby maintaining constant width of the pulse. The shift in the current pulse due to the occurrence of the jitter in the reset signal 308 does not affect the next current pulse as the pulses in the current $I_{DAC}$ 324 follows RZ coding scheme. The RZ coding scheme prevents interference that may creep in between two consecutive current pulses.

CONCLUSION

Although embodiments for jitter insensitive single bit DAC have been described in language specific to structural features and/or methods, it is to be understood that the appended claims are not necessarily limited to the specific features or methods described. Rather, the specific features and methods are disclosed as exemplary implementations for insensitive single bit DAC.

What is claimed is:

1. An analog to digital converter (ADC) that provides sampled and quantized signal comprising:
    a summing device that provides a difference signal;
    an integrator that receives the difference signal, and provides an output signal;
    a comparator that receives and compares the output signal of the integrator with a reference signal, and provides a data stream; and
    a jitter insensitive digital to analog converter (DAC) that receives the data stream, using a coding scheme to cancel jitter effect in a reset signal, and outputs an analog signal that is fed back to the summing device.

2. The ADC of claim 1, wherein the integrator is a fully differential integrator that generates a fully differential voltage.

3. The ADC of claim 1, wherein the integrator is higher order loop filter.

4. The ADC of claim 1, wherein the integrator receives an analog input and integrates the difference between the analog signal from the jitter insensitive DAC.

5. The ADC of claim 1, wherein the reference voltage is ground or zero volts.

6. The ADC of claim 1, wherein the data stream of the comparator includes high and low values which are switched based on the value of the reference signal.

7. The ADC of claim 1, wherein the jitter insensitive DAC uses a Return to Zero (RZ) coding scheme to cancel the jitter effect in the reset signal.

8. A delta sigma analog to digital converter (ADC) comprising:
    a feedback loop, a 1-bit jitter insensitive digital to analog converter (DAC) in the feedback loop using a coding scheme to provide a zero current pulse before a rise of a next current pulse in the 1-bit jitter insensitive DAC;
    a summing device in the feedback loop, that receives an analog signal and a feedback signal from the 1-bit jitter insensitive digital to analog converter (DAC);
    a loop filter that integrates a difference between the analog signal and the feedback signal, and outputs a signal; and
    a 1-bit comparator that receives and compares the signal from the loop filter with a reference voltage.

9. The delta sigma ADC of claim 8, wherein the 1-bit jitter insensitive DAC includes a constant current generator comprised of multiple switches that change circuit connections in the 1-bit jitter insensitive DAC based on one or more external inputs.

10. The delta sigma ADC of claim 9, wherein the one or more external inputs is a reset signal in a path that includes a delay element.

11. The delta sigma ADC of claim 8, wherein the 1-bit jitter insensitive DAC includes a differential source that receives 1-bit data from the delta sigma ADC.

12. The delta sigma ADC of claim 8, wherein the reference voltage is ground or zero volts.

13. The delta sigma ADC of claim 8, wherein the 1-bit jitter insensitive DAC provides a current that has a constant current pulse width.

14. The delta sigma ADC of claim 8, wherein the loop filter is a higher order filter.

15. The ADC of claim 1, wherein the coding scheme results in a zero current pulse before a rise of a next current pulse in the jitter insensitive DAC.

16. The ADC of claim 1, wherein the jitter insensitive DAC uses a delay element in a reset signal.

17. The delta sigma ADC of claim 8, wherein the coding scheme cancels jitter effects in the 1-bit jitter insensitive DAC.

* * * * *